United States Patent
Mrcarica et al.

(10) Patent No.: US 8,169,758 B2
(45) Date of Patent: May 1, 2012

(54) PATH SHARING HIGH-VOLTAGE ESD PROTECTION USING DISTRIBUTED LOW-VOLTAGE CLAMPS

(75) Inventors: Zeljko Mrcarica, Zurich (CH); Fabrice Blanc, Crolles (FR)

(73) Assignee: NXP B.V., Eindhoven (NL)

( * ) Notice: Subject to any disclaimer, the term of this patent is extended or adjusted under 35 U.S.C. 154(b) by 282 days.

(21) Appl. No.: 11/995,899

(22) PCT Filed: Jul. 17, 2006

(86) PCT No.: PCT/IB2006/052436
§ 371 (c)(1),
(2), (4) Date: Oct. 24, 2008

(87) PCT Pub. No.: WO2007/010472
PCT Pub. Date: Jan. 25, 2007

(65) Prior Publication Data
US 2009/0052101 A1 Feb. 26, 2009

(30) Foreign Application Priority Data
Jul. 22, 2005 (EP) .................................. 05106737

(51) Int. Cl.
*H02H 9/00* (2006.01)
(52) U.S. Cl. ........................ 361/56; 361/91.1; 361/111
(58) Field of Classification Search ................ 361/56, 361/91.1, 111
See application file for complete search history.

(56) References Cited

U.S. PATENT DOCUMENTS

| | | | |
|---|---|---|---|
| 4,821,096 A * | 4/1989 | Maloney | 327/427 |
| 5,515,232 A * | 5/1996 | Fukazawa et al. | 361/111 |
| 6,002,568 A * | 12/1999 | Ker et al. | 361/111 |
| 6,075,686 A * | 6/2000 | Ker | 361/56 |
| 2003/0076636 A1 | 4/2003 | Ker et al. | |
| 2005/0045955 A1* | 3/2005 | Kim et al. | 257/355 |
| 2005/0168894 A1* | 8/2005 | Gossner | 361/56 |
| 2006/0082938 A1* | 4/2006 | Ochoa et al. | 361/56 |

FOREIGN PATENT DOCUMENTS

| | | |
|---|---|---|
| DE | 102004004789 B3 | 3/2005 |
| JP | 01-148019 A | 6/1989 |
| JP | 06-104721 A | 4/1994 |
| JP | 06-177330 A | 6/1994 |
| JP | 09-121453 A | 5/1997 |

OTHER PUBLICATIONS

Jaesik, Lee; et al "Understanding and Addressing the Noise Induced by Electrostatic Discharge in Multiple Power Supply Systems" Proceedings 2001 International Conference on Computer Design (ICCD) Sep. 23, 2001, pp. 406-411.

* cited by examiner

*Primary Examiner* — Jared Fureman
*Assistant Examiner* — Terrence Willoughby

(57) ABSTRACT

Integrated circuit (20) comprising several different voltage rails ($V_5$ to $V_1$) and an on-chip ESD protection circuit. The ESD protection circuit comprises at least one group (21, 22, 23) of ESD clamp devices (C1-C4). The ESD clamp devices (C1-C4) are arranged in a ladder-configuration. This ladder-configuration is characterized in that there is one of the ESD clamp devices interposed between each of the power rails ($V_5$ to $V_1$) and the respective power rail having a next lower voltage. Due to this arrangement an ESD current path is defined between each one of the power rails and the power rail having the next lower voltage. The ESD clamp devices (C1-C4) are off under normal power operation of the integrated circuit (20).

19 Claims, 4 Drawing Sheets

PATH SHARING HIGH-VOLTAGE ESD PROTECTION USING DISTRIBUTED LOW-VOLTAGE CLAMPS

The invention concerns integrated circuits with ESD protection.

In integrated circuit (IC) applications, typically different power domains are used in one design. Examples are liquid crystal display (LCD) drivers, ICs for automotive applications, power management ICs, and so forth.

These ICs are quite often realized in CMOS (complementary metal oxide semiconductor) technology. The transistors in these ICs operate in different voltage domains and thus have to have different doping concentrations and different gate thickness. The higher the voltage is in a particular voltage domain, the bigger the minimum transistor size has to be.

Such CMOS ICs have to be protected against electrostatic discharge (ESD) in order to make sure that the transistors are not damaged by the current or by the voltage peaks.

The respective transistor design must satisfy the known ESD requirements. Regarding the ESD clamps used, the requirements can be summarized as follows:

Each of the power domains needs an ESD protection. This means that between each of the two power rails ESD paths must be realized, that will be preferred in positive and negative ESD stress situations. It is common to use one of the power domains as an ESD reference, and to build the ESD paths between the reference and each power domain, thus providing the whole ESD concept. Usually, in CMOS ICs the ground supply rail (connected to substrate) is used as reference, since it is used everywhere in the chip.

Furthermore, a sufficient number of such clamps is needed to ensure that a power drop on the power routing is not too big to create damage somewhere else in the IC.

Each of these clamps has to be big enough to transport the ESD current.

Due to the employment of different clamps in the different voltage domains, the engineering is difficult and not feasible with all types of available clamps.

In an ESD concept, in addition to the ESD path between the power rails, ESD paths from each IC pin (external terminal) to the appropriate power rail must be provided. The invention described here does not affect the part of the ESD concept for pin-to-rail protections, therefore it is not discussed further.

These requirements cause the following two problems. (1) A large percentage of the chip area has to be dedicated to the ESD protection means. (2) The power routing and floorplan of the IC have to take into account an optimum placement and connections of the ESD clamps. The latter are additional requirements that have to be observed in addition to the conventional design rules.

It is common to use one of the power domains a reference. Usually, the ground line (substrate) is used for this purpose, as mentioned above. This "classical" ESD concept is illustrated in FIG. 1, where five different power rails ($V_1$ through $V_5$) with different values of the voltage are given. The clamps C1 through C4 are employed to clamp each of the power rails to the substrate supply voltage $V_1$. In addition, diodes may be employed in order to ensure that there exists a short ESD path for stresses from the lower to the upper power rails. This illustration is just one typical example. It is to be understood, that the actual implementation depends on the particular technology and voltage ranges used.

In this context it is to be mentioned that the clamps for the higher voltage domains (e.g., the clamp C1 in FIG. 1) use high-voltage devices, which demand a larger area. In addition, each clamp and/or diode has to be placed several times in the design layout.

It is an object of the present invention to provide an integrated circuit where on one hand the chip area required for ESD circuitry is reduced, as compared to conventional ESD protection solutions, and where on the other hand the ESD protection requirements (standards) are satisfied.

It is an object of the present invention to provide an improved and more flexible ESD protection scheme.

These and other objects are accomplished by an integrated circuit (IC) according to claim 1. Further advantageous implementations are given in the dependent claims.

According to the present invention, an integrated circuit with several different voltage rails is provided with a novel and inventive on-chip ESD protection circuit. The on-chip ESD protection circuit comprises at least one group of ESD clamp devices. This group comprises n−1 ESD clamp devices, if there are n different voltage rails with different values of the supply voltage in the integrated circuit. The n−1 ESD clamp devices are arranged in a ladder-configuration, where there is one of said n−1 ESD clamp devices interposed between each of said n power rails and a respective power rail having a next lower voltage. Due to the ladder-configuration of the ESD clamp devices a direct ESD current path is provided between each one of said n power rails and the power rail having the next lower voltage. This path does not go over the ESD reference line, and is therefore shorter.

According to a preferred embodiment of the invention there is more than one group of ESD clamp devices and the ESD clamp devices are distributed across said integrated circuit.

In an advantageous implementation inter-rail current paths are established in case of an ESD event. These inter-rail current paths are going directly from any one of said n power rails either to the respective power rail having the next lower voltage or to the respective power rail having the next higher voltage.

Further advantageous embodiments are addressed in connection with the detailed description.

For a more complete description of the present invention and for further objects and advantages thereof, reference is made to the following description, taken in conjunction with the accompanying drawings, in which.

Electrostatic discharge (ESD) is a single, fast, high current transfer of electrostatic charge between two objects at different electrostatic potentials. If this high current transfer exceeds the maximum rating of the fabrication process, it will damage components of the IC. Besides, if the voltage drop created by the high current exceeds the maximum rating of the fabrication process, it will damage components of the IC.

An integrated circuit thus is typically provided with an on-chip ESD protection circuit having several ESD clamp devices.

A first embodiment of the present invention is described in connection with FIG. 2A. This Figure shows a schematic representation of the on-chip ESD protection circuit of an integrated circuit 10. The integrated circuit 10 comprises n=5 different voltage rails. During the regular operation of the integrated circuit 10, voltages $V_1$ through $V_5$ are established/applied, as illustrated. For the purposes of the present description it is assumed that $V_1<V_2<V_3<V_4<V_5$. The n=5 different voltage rails define n different power domains.

The on-chip ESD protection circuit of the invention is characterized by a so-called ladder arrangement of several inter-rail ESD clamp devices C1 through C4. As illustrated in FIG. 2A, The integrated circuit 10 comprises at least one group of ESD clamp devices C1 through C4. Each such group comprises n−1 ESD clamp devices. That is, in the present embodiment one needs just the four ESD clamp devices C1 through C4.

Figure 2A:
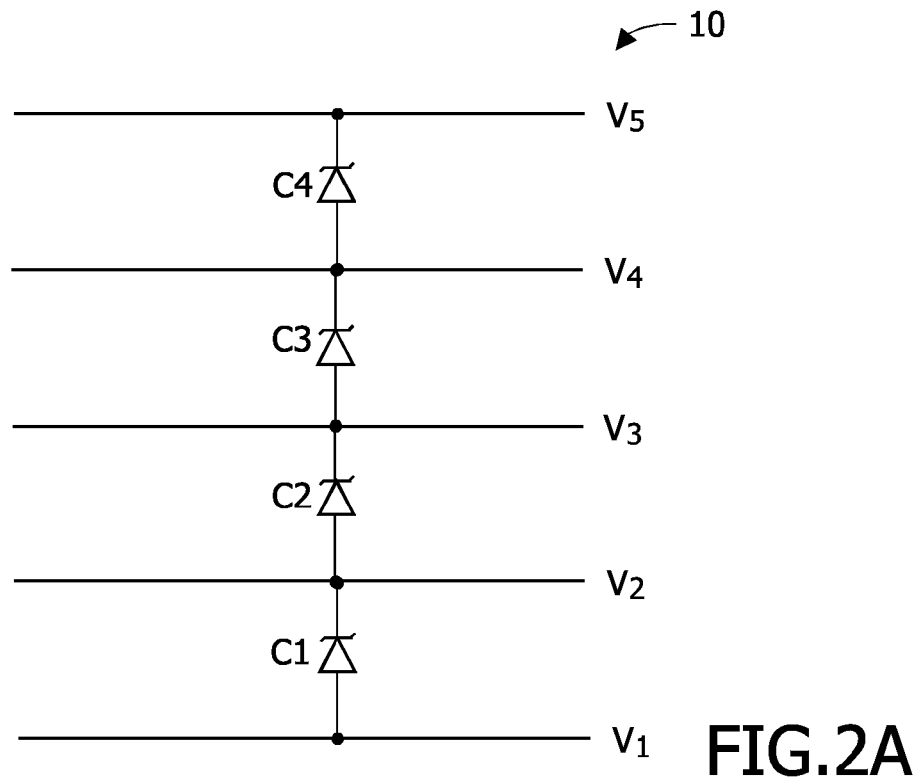
FIG. 2A is a schematic layout representation of the inventive ladder arrangement of inter-rail ESD clamp devices, in accordance with a first embodiment of the present invention.
Figure 2B:
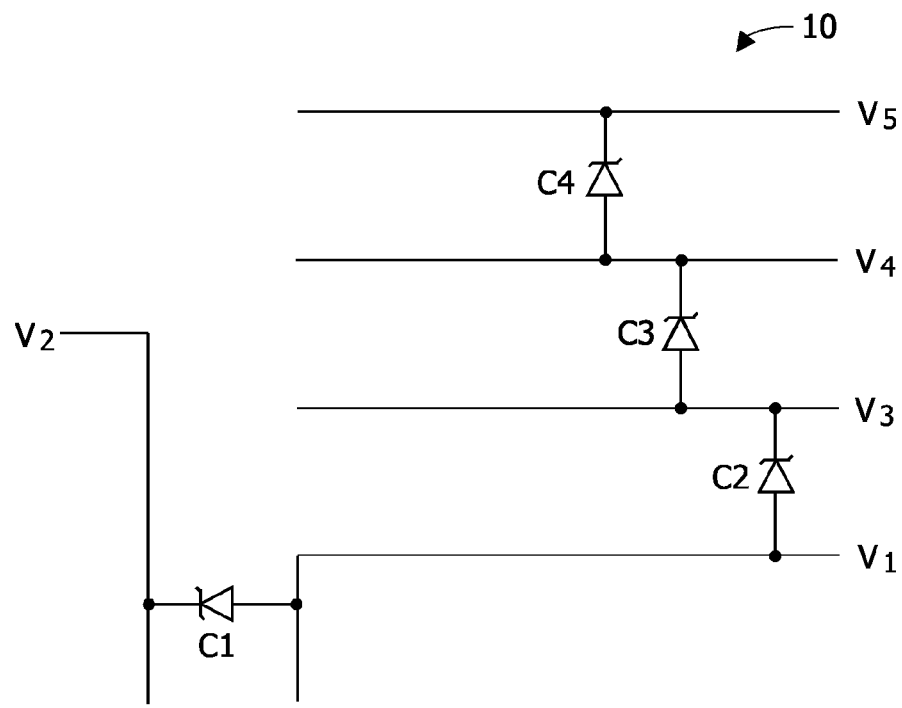
FIG. 2B is a different representation of the inventive ladder arrangement of FIG. 2A.

It is obvious that the expression "ladder arrangement" is used to describe the arrangement of the clamp devices in a schematic layout (cf. FIG. 2A). In an actual embodiment, the arrangement of the individual clamp devices inside the integrated circuit may not be a ladder arrangement since the power rails typically do not run in parallel and since the whole layout is quite often folded. A more realistic illustration of this embodiment is schematically depicted in FIG. 2B.

The expression "ladder arrangement" is used in order to indicate that in a schematic layout (cf. FIG. 2A) the voltage rails serve as the horizontal runs of the ladder and the ESD clamp devices C1 through C4 serve as a vertical pole or stud of the ladder.

The ladder-configuration is characterized in that there is one of the n−1 ESD clamp devices interposed between each of the n power rails. In the present embodiment, the ESD clamp device C1 is interposed between the power rails $V_1$ and $V_2$; the ESD clamp device C2 is interposed between the power rails $V_2$ and $V_3$; the ESD clamp device C3 is interposed between the power rails $V_3$ and $V_4$; and the ESD clamp device C4 is interposed between the power rails $V_4$ and $V_5$. The respective ESD clamp devices are thus also referred to as inter-rail clamp devices since they interconnect two adjacent rails. The term adjacency in this context is used to described the voltage/potential adjacency and not necessarily the topographical adjacency.

The inter-rail clamp devices C1 through C4, according to the present invention, define an ESD current path between any one of the n voltage rails and the voltage rail having the next lower voltage. The protection scheme thus is also referred to as rail-to-rail protection scheme.

The ESD clamp devices are designed so that they do not influence the normal operation of the integrated circuit 10 or 20. That is, each of the ESD clamp devices is off (not conducting current) under normal power operation. In case of an ESD event, however, the ESD clamp devices are triggered and establish an ESD current path.

Figure 1:
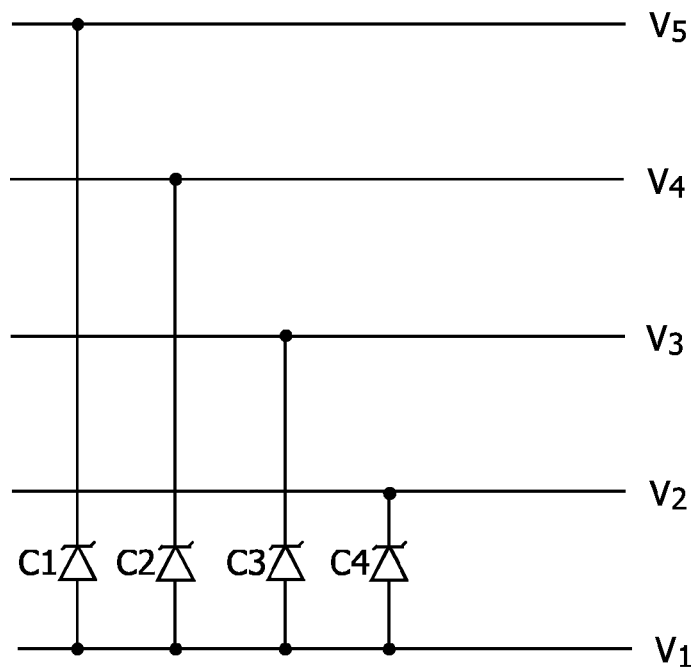
FIG. 1 is a schematic representation of a conventional ESD protection scheme using an ESD reference power domain.

Please note that in a conventional ESD circuit, such as the one depicted in FIG. 1, one would need high-voltage ESD clamp devices at least for the protection of the high voltage rails. According to the present invention, there is no need for high-voltage ESD clamp devices anymore, since the inter-rail clamp devices just have to cope with the relative voltage difference of adjacent power rails. (The ESD clamps must sustain the high-voltage difference with regard to substrate, but not across the device terminals). The difference with respect to the prior art solutions is now addressed by means of an example. If one assumes the following voltages $V_1=0V$, $V_2=5V$, $V_3=8V$, $V_4=15V$, and $V_5=20V$, then the clamp devices in FIG. 1 have to be able to withstand the following voltages: C1: 20V; C2: 15V; C3: 8V; C4: 5V.

The clamp devices in FIG. 2A have to be able to withstand the following voltages only: C1: 5V; C2: 3V; C3: 7V; C4: 5V. First of all, smaller clamps and fewer clamp types are needed. Secondly, the voltages on each of the clamp devices is defined by the relative voltage difference of adjacent rails only. This means that the voltages are much lower. As a consequence, one needs no high-voltage clamp devices anymore.

There is another aspect that is important to mention. In the implementation of FIG. 1 there are four different types of clamp devices needed (one for 20V, one for 15V, one for 8V, and one for 5V), whereas in case of the embodiment of the FIG. 2A there are just three different types of clamp devices needed (one for 3V, two for 5V, one for 7V).

As a consequence, the ESD protection circuit according to the invention is less complex, less complicated and much more flexible. If the relative voltage steps between adjacent rails are equal (e.g., $V_1=0V$, $V_2=2V$, $V_3=4V$, $V_4=6V$, and $V_5=8V$), then one would only need one type of clamp devices (namely only 2V clamp devices).

Figure 3:
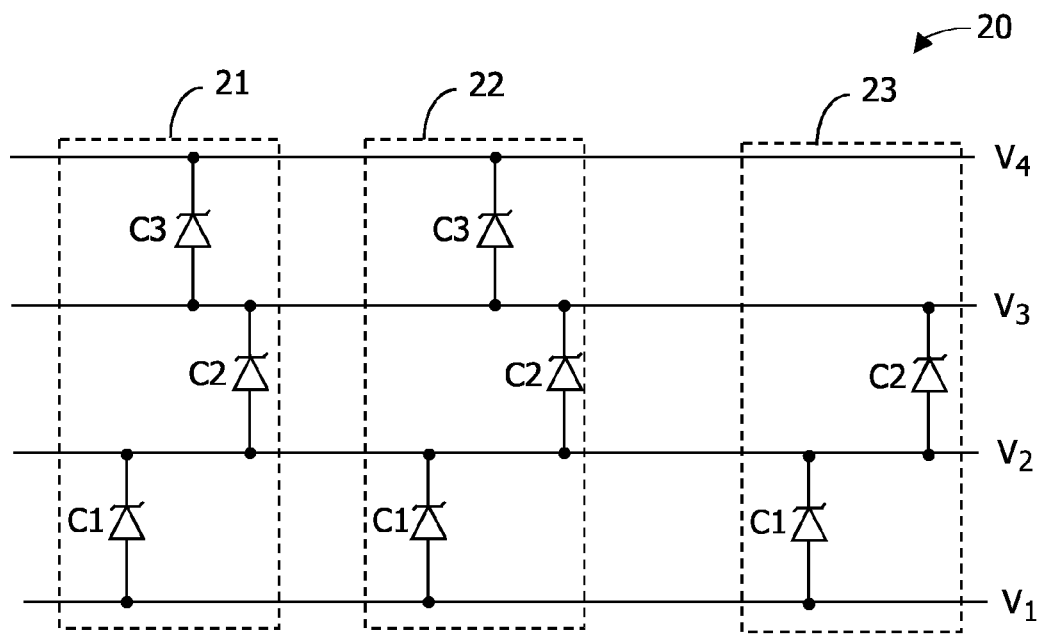
FIG. 3 is a schematic representation of the inventive distributed ladder arrangement with several groups of inter-rail ESD clamp devices, in accordance with a second embodiment of the present invention.

A further embodiment is illustrated in FIG. 3. This Figure shows a schematic representation of the on-chip ESD protection circuit of an integrated circuit 20. The integrated circuit 20 comprises n=4 different voltage rails. During the operation of the integrated circuit 10, voltages $V_1$ through $V_4$ are established/applied, as illustrated. For the purposes of the present description it is assumed that $V_1<V_2<V_3<V_4$. The n=4 different voltage rails define n=4 different power domains. The ESD protection circuits comprise m=3 groups 21, 22, 23. The groups 21 and 22 each comprise three ESD clamp devices C1 through C3. The group 23 just comprises the clamp devices C1 and C2. Also in FIG. 3 the ESD clamp devices are arranged in a ladder-configuration where one of the n−1 ESD clamp devices is interposed between each of the n=3 power rails. Due to this, an ESD current path is defined between each one of said n=3 power rails and the power rail having the next lower voltage.

FIG. 3 is also referred to as ladder arrangement with horizontally distributed ESD clamp devices.

All other aspects addressed in connection with FIGS. 2A and 2B also apply in case of the embodiment of FIG. 3.

Figure 4:
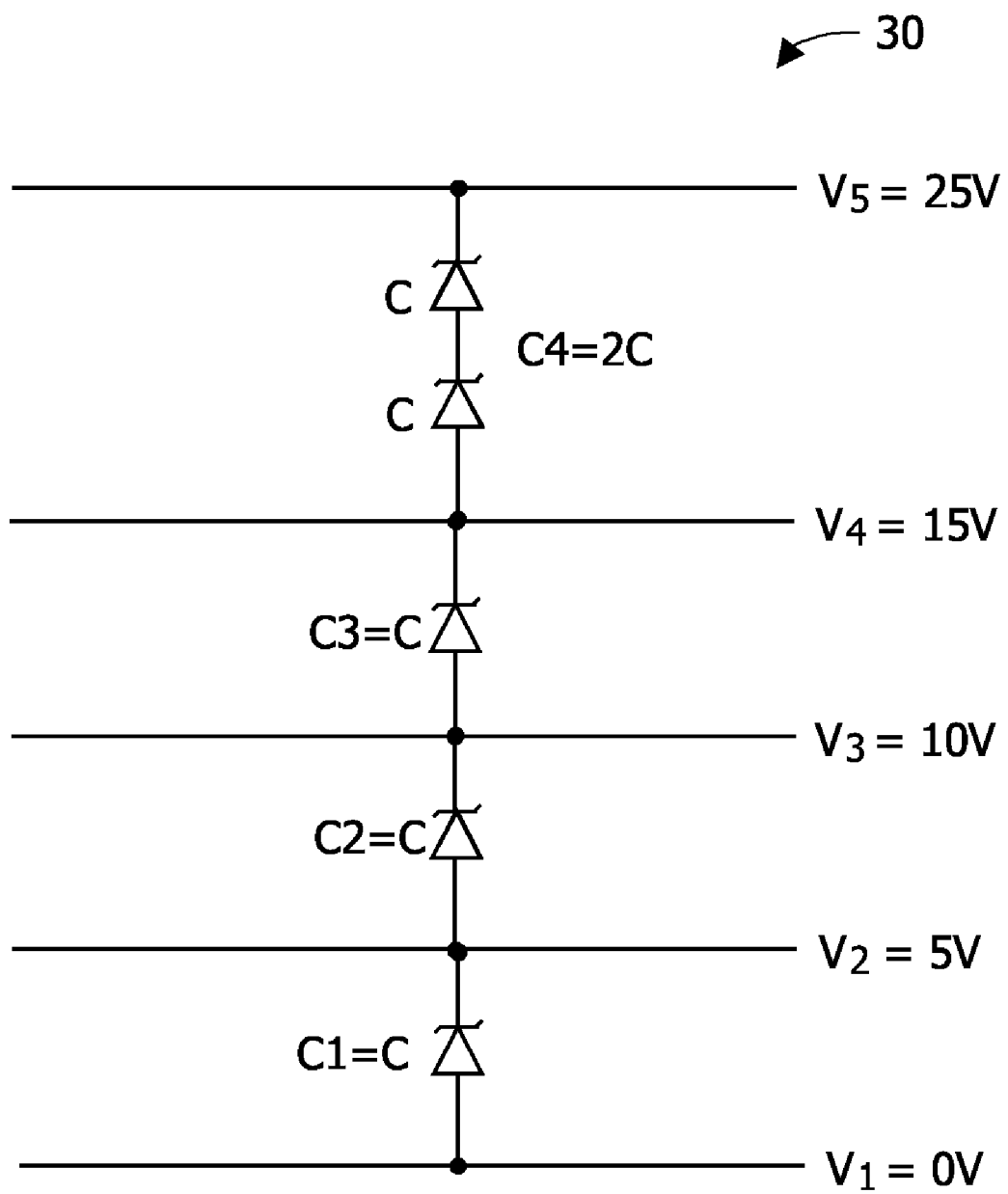
FIG. 4 is a schematic layout representation of the inventive ladder arrangement of inter-rail ESD clamp devices, in accordance with a third embodiment of the present invention.

A further embodiment is illustrated in FIG. 4. This Figure shows a schematic representation of the on-chip ESD protection circuit of an integrated circuit 30. The integrated circuit 30 comprises n=5 different voltage rails. During the operation of the integrated circuit 10, voltages $V_1$ through $V_5$ are established/applied, as illustrated. For the purposes of the present description it is assumed that $V_1=0V$, $V_2=5V$, $V_3=10V$, $V_4=15V$, and $V_5=25V$. Note that the voltage difference between $V_4$ and $V_5$ is 10V.

Like in FIG. 2A, the ESD protection circuits comprise just one group of clamp devices C1 through C4. The group comprises four ESD clamp devices C1 through C4. Since the voltages steps are the same for the lower four voltage rails ($\Delta V=5V$), the same type of ESD clamp device can be used. Since the voltage difference between the voltage rails $V_4$ and $V_5$ is twice the voltage difference between the other voltage rails, the ESD clamp device is made by putting two ESD clamp devices C in series. This combination of two or more ESD clamp devices between two rails is herein referred to as stacked series connection.

All other aspects addressed in connection with FIGS. 2A, 2B and 3 also apply in case of the embodiment of FIG. 4.

The clamp devices according to the invention are so-called isolated clamp devices where none of the terminals of the devices is connected to substrate. Very well suited are PMOS transistors in a gate-up configuration. In this case the bulk of the PMOS transistor is high. Preferably, the PMOS transistor is situated in an n-well if the substrate of the integrated circuit is p$^-$.

NMOS transistors are, according to the present invention, preferably only be used as the bottom most device (e.g. as ESD clamp device C1). The NMOS transistor then sits in a p-well in a p-substrate.

Figure 5:
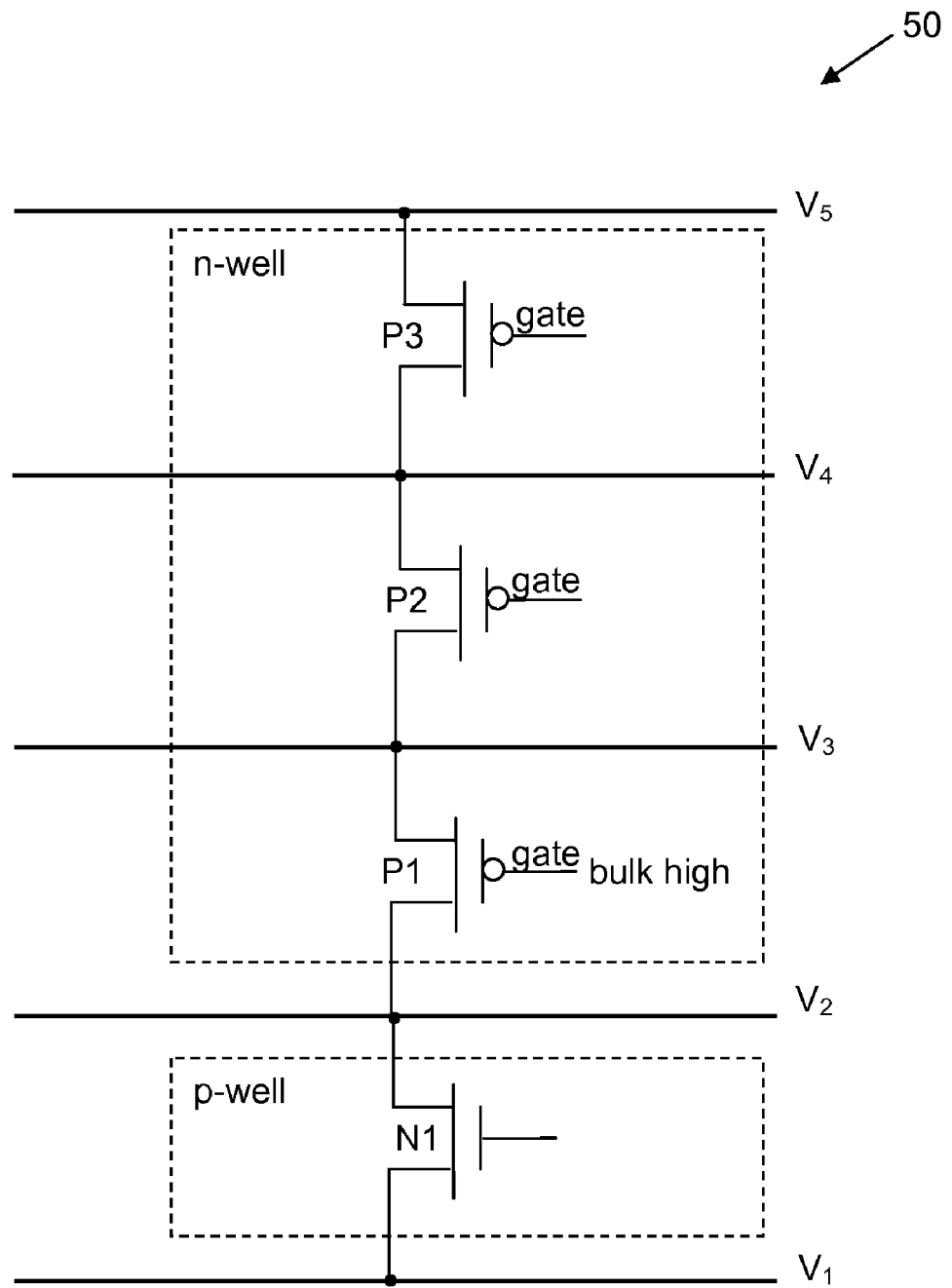
FIG. 5 is a schematic layout representation of the inventive ladder arrangement of inter-rail ESD clamp devices in accordance with a fourth embodiment of the present invention.

FIG. 5 shows a schematic representation of the on-chip ESD protection circuit of an integrated circuit 50. The integrated circuit 50 comprises 5 different voltage rails $V_1$ through $V_5$. As illustrated in FIG. 5, the integrated circuit 50 also comprises at least one group of ESD clamp devices, which includes an NMOS transistor N1 and PMOS transistors P1-P3. The NMOS transistor N1 is situated in a p-well and serves as the bottom most ESD clamp device. The PMOS transistors P1-P3 are situated in an n-well. A gate terminal of the PMOS transistors P1-P3 is connected to bulk high.

The NMOS ESD clamp devices usually have snapback behavior. If they were used within the same power domain, this could prevent the horizontal sharing of the ESD current between clamps connected in parallel. It is thus recommended to use only clamps that show no or almost no snapback, e.g. PMOS or triggered NMOS clamps.

Instead of the PMOS or NMOS transistors, one can also use Zener diodes or bipolar transistors as ESD clamp devices.

It is an advantage of the present invention that one is able to optimize the ESD concept for each power domain or voltage level for itself. Between some power domains one may use more clamp devices than between other for instance (cf. FIG. 3).

The embodiments where two or more groups of clamp devices are being used (cf. FIG. 3, for instance) are advantageous since several ESD clamp devices are arranged in parallel between the same rail pairs. In an ESD event, several ESD clamp devices are shared. As a consequence, the resistivity is reduced, therefore smaller clamps can be used.

The clamp devices C1-C4 are low-voltage clamp devices preferably being designed for voltages below 10V.

It is another advantage of the embodiment of FIG. 3 that the parasitic capacitance of the ESD clamp devices absorbs some of the stress in case of an ESD event. Since there are several ESD clamp devices arranged in parallel, the parasitic capacitance are typically larger than in case of prior art ESD protection circuits. This means that very fast pulses go into the parasitic capacitances. This gives the ESD clamp devices some more time to trigger and establish the ESD current path, and facilitates better voltage distribution for simultaneous triggering.

The prior art approaches usually use the ground line (substrate) of the integrated circuit as reference ($V_1$ in FIG. 1). In today's CMOS implementations, however, the substrate is not a good conductor anymore, since high-resistive substrate is preferred for noise suppression. As a consequence, the strong ESD currents may produce a voltage drop on the reference line. This problem is avoided with the present invention since one does not have a reference line anymore. The inventive ESD protection scheme is thus also referred to as "reference-free circuit".

If according to the present invention each of the of ESD clamp devices has a maximum clamp voltage at a given ESD peak current, that is below the breakdown o the protected devices inside the IC, the ESD protection scheme works properly and reliably. A discharge pulse is safely diverted and does not destroy or damage the circuitry of the IC.

The ESD clamp devices according to the invention only become "active" in case of an electrostatic discharge event. Under normal power operation these ESD clamp devices are off.

It is one of the remarkable advantages of the present invention that chip area is saved while at the same time providing for an ESD protection that is at least as good and reliable as the ESD protection in conventional integrated circuits. The invention requires fewer and/or smaller ESD clamp devices and the engineering is less complicated since fewer types of ESD devices are needed. The ESD clamp devices also get simpler since they are low-voltage. The floorplanning and supply routing is simpler from the ESD point of view.

In the following some further advantages and aspects of the invention are mentioned:

The ESD current path is, as mentioned above, shared in the "vertical direction" if one has just one group (cf. FIG. 2A, for instance). The clamp C3 in FIG. 2A is for example used for the following paths: $V_5 \Leftrightarrow V_3$, $V_5 \Leftrightarrow V_2$, $V_5 \Leftrightarrow V_1$, $V_4 \Leftrightarrow V_3$, $V_4 \Leftrightarrow V_2$, $V_4 \Leftrightarrow V_1$. This means that the single group of ESD clamp devices in FIG. 2A can replace all the elements of C1-C4 of FIG. 1. And since only low-voltage ESD clamps devices are required according to the invention, the chip area occupied by all the devices of FIG. 2A is about the same as the chip area required by the high-voltage clamp C1 in FIG. 1. This example illustrates quite well how remarkably the savings are.

If more than one group of ESD clamp devices are employed (see FIG. 3 for instance), the ESD path is also shared in "horizontal direction", as there are several parallel ESD clamp devices between each two rails. These parallel ESD clamp devices share the ESD current. Since these ESD clamp devices work together, they can be smaller, which in turn saves further chip area.

The ESD clamps over the ladder path (e.g., $V_5$ to $V_1$) do not have to be placed next to each other, that is, they can be distributed. This gives more flexibility on the layouting and floor planning of an integrated circuit.

When there is ESD stress over the ladder path (e.g., $V_5$ to $V_1$), the voltage rails in between ($V_4$, $V_3$, $V_2$) and any other parasitic capacitances between the two references are adding to the effective parasitic capacitance of the ladder. This effective parasitic capacitance helps in the distribution of the ESD stress current over the next clamp stage.

The low-voltage ESD clamp devices, as used in connection with the present invention, show a better ESD behavior than the high-voltage ones (better control of the breakdown and snapback voltage).

Low-voltage PMOS transistors exhibit very low snapback and are thus suitable for the present concept. The low-voltage NMOS transistors can be triggered and controlled for the required low snapback.

For new high-voltage process developments of integrated circuits it is also an advantage to have an ESD concept, like the one presented herein, that relies on low-voltage ESD clamp devices since they are well known and ready from the beginning.

In the drawings and specification there has been set forth preferred embodiments of the invention and, although specific terms are used, the description thus given uses terminology in a generic and descriptive sense only and not for purposes of limitation.

The invention claimed is:

1. An integrated circuit comprising n different voltage rails, with n being an integer number greater than two, thus defining n different power domains, further comprising an on-chip ESD protection circuit, wherein:

said ESD protection circuit comprises at least one group of ESD clamp devices, each such group comprising n−1 ESD clamp devices, said n−1 ESD clamp devices being arranged in a ladder-configuration, said ladder-configuration being characterized in that there is one of said n−1 ESD clamp devices interposed between each of said n voltage rails and the respective voltage rail having a next lower voltage, thus defining an ESD current path between each one of said n voltage rails and the voltage rail having the next respective lower voltage, and wherein each of said ESD clamp devices is off under normal power operation of said integrated circuit, wherein at least one NMOS transistor, situated in a p-well, serves as a bottom most ESD clamp device of one group of the at least one group of ESD clamp devices, the bottom most ESD clamp device being connected to two adjacent voltage rails having two lowest voltages of said n voltage rails, and wherein PMOS transistors situated in an n-well serve as the other ESD clamp devices of the one group of the at least one group of ESD clamp devices, and wherein none of terminals of the ESD clamp devices is connected to a substrate of the integrated circuit.

2. The integrated circuit of claim 1, wherein there are several groups of ESD clamp devices with ESD clamp devices being distributed across said integrated circuit.

3. The integrated circuit of claim 1, wherein during an ESD event the ESD current paths are inter-rail current paths going from any one of said n voltage rails either to the respective voltage rail having the next lower voltage or to the respective voltage rail having the next higher voltage.

4. The integrated circuit of claim 1, wherein during an ESD event the voltage difference between any of the n voltage rails is kept below a given threshold voltage in order to prevent damages in said integrated circuit.

5. The integrated circuit of claim 1, wherein said clamp devices are low-voltage clamp devices, preferably designed for voltages below 10V.

6. The integrated circuit of claim 1, wherein said ESD current path works in both direction, that is from a first voltage rail with lower voltage to the next voltage rail with the next higher voltage and from the first voltage rail to the next voltage rail with the next lower voltage.

7. The integrated circuit of claim 1, wherein said ladder-configuration is characterized in that said ESD clamp devices serve as vertical elements of a respective ladder and said voltage rails are the runs of the respective ladder.

8. The integrated circuit of claim 1, wherein said ladder-configuration is characterized in that said ESD clamp devices are vertically stacked.

9. The integrated circuit of claim 1, wherein a plurality of said ESD clamp devices are being shared in case of an ESD event.

10. The integrated circuit of claim 1, wherein said ESD clamp devices are devices having snapback small enough to enable good path sharing between clamps connected in parallel.

11. The integrated circuit of claim 1, wherein during an ESD event the ESD clamp devices of several groups are triggered.

12. The integrated circuit of claim 1, comprising several ESD clamp devices per voltage rail.

13. The integrated circuit of claim 1, wherein none of the n voltage rails is used as a common reference voltage line for the n−1 ESD clamp devices of one group of the at least one group of ESD clamp devices.

14. The integrated circuit of claim 1, wherein said n voltage rails are electrically parallel to each other and each clamp device is connected between two adjacent voltage rails.

15. The integrated circuit of claim 1, wherein each two adjacent voltage rails in said n voltage rails are connected through a single ESD clamp device.

16. The integrated circuit of claim 1, wherein all of the ESD clamp devices are configured to conduct ESD current in the same direction.

17. The integrated circuit of claim 2, wherein each ESD clamp device in each of the several groups of ESD clamp devices are connected to a unique combination of two voltage rails in said n voltage rails.

18. An integrated circuit comprising n different voltage rails, with n being an integer number greater than two, thus defining n different power domains, further comprising an on-chip ESD protection circuit, wherein:

said ESD protection circuit comprises at least one group of ESD clamp devices, each such group comprising n−1 ESD clamp devices, said n−1 ESD clamp devices being arranged in a ladder-configuration, said ladder-configuration being characterized in that there is one of said n−1 ESD clamp devices interposed between each of said n voltage rails and the respective voltage rail having a next lower voltage, thus defining an ESD current path between each one of said n voltage rails and the voltage rail having the next respective lower voltage, and wherein said ESD clamp devices are isolated devices where none of terminals of said ESD clamp devices is connected to a substrate of said integrated circuit, wherein at least one NMOS transistor, situated in a p-well, serves as a bottom most ESD clamp device of one group of the at least one group of ESD clamp devices, the bottom most ESD clamp device being connected to two adjacent voltage rails having two lowest voltages of said n voltage rails, and wherein PMOS transistors situated in an n-well serve as the other ESD clamp devices of the one group of the at least one group of ESD clamp devices, and wherein none of terminals of the ESD clamp devices is connected to a substrate of the integrated circuit.

19. An integrated circuit comprising n different voltage rails, with n being an integer number greater than two, thus defining n different power domains, further comprising an on-chip ESD protection circuit, wherein:

said ESD protection circuit comprises at least one group of ESD clamp devices, each such group comprising n−1 ESD clamp devices, said n−1 ESD clamp devices being arranged in a ladder-configuration, said ladder-configuration being characterized in that there is one of said n−1 ESD clamp devices interposed between each of said n voltage rails and the respective voltage rail having a next lower voltage, thus defining an ESD current path between each one of said n voltage rails and the voltage rail having the next respective lower voltage, and wherein there are more than two groups of ESD clamp devices with ESD clamp devices being distributed across said integrated circuit, wherein at least one NMOS transistor, situated in a p-well, serves as a bottom most ESD clamp device of one group of the at least one group of ESD clamp devices, the bottom most ESD clamp device being connected to two adjacent voltage rails having two lowest voltages of said n voltage rails, and wherein PMOS transistors situated in an n-well serve as the other ESD clamp devices of the one group of the at least one group of ESD clamp devices, and wherein none of terminals of the ESD clamp devices is connected to a substrate of the integrated circuit.

* * * * *